United States Patent [19]

Zobrist et al.

[11] 4,112,425
[45] Sep. 5, 1978

[54] TRANSIENT ANALOG SIGNAL CAPTURE AND TRANSMISSION SYSTEM

[75] Inventors: Gerald J. Zobrist; William L. Townsend; Steven K. Orr, all of Cincinnati, Ohio

[73] Assignee: Zonic Technical Laboratories, Inc., Cincinnati, Ohio

[21] Appl. No.: 663,356

[22] Filed: Mar. 3, 1976

[51] Int. Cl.² ............................................. H03K 13/00
[52] U.S. Cl. ........................ 340/347 AD; 179/2 DP; 340/347 DA; 340/347 M; 364/900
[58] Field of Search ................ 340/347 AD, 324 AD, 340/173 R, 172.5, 347 DA, 172.5 M; 178/DIG. 3, 6.8, 88; 179/2 DP; 73/DIG. 1

[56] References Cited

U.S. PATENT DOCUMENTS

| | | | |
|---|---|---|---|
| 3,226,480 | 12/1965 | Wright et al. | 179/2 DP |
| 3,299,210 | 1/1967 | Bandy | 179/2 DP |
| 3,348,153 | 10/1967 | Featherston | 178/88 X |
| 3,524,935 | 8/1970 | Gonsewski et al. | 179/2 DP |
| 3,566,396 | 2/1971 | Paine | 340/347 AD |
| 3,623,010 | 11/1971 | Burkhalter | 445/1 |
| 3,662,380 | 5/1972 | Cargile | 340/347 AD |
| 3,882,305 | 5/1975 | Johnstone | 445/1 |
| 3,950,607 | 4/1976 | Southworth et al. | 178/6.8 X |
| 3,967,250 | 6/1976 | Senda et al. | 445/1 |
| 3,972,031 | 7/1976 | Riemenschneider et al. | 340/173 R |

OTHER PUBLICATIONS

Analog-Digital Conversion Handbook, Analog Devices, Inc., Jun. 1972, pp. I-70 to I-72, I-84 to I-92.

*Primary Examiner*—Thomas J. Sloyan
*Attorney, Agent, or Firm*—Wood, Herron & Evans

[57] ABSTRACT

A system for monitoring a physical phenomenon manifested by a change in displacement, including means for sampling, digitizing and recording a transient analog electrical signal associated therewith having a component of interest at a given frequency not exceeding approximately 100 KHz., and means for transmitting said digitized analog signal samples over a low grade communication link having an upper frequency limit substantially less than the high frequency component of interest in the transient signal.

24 Claims, 1 Drawing Figure

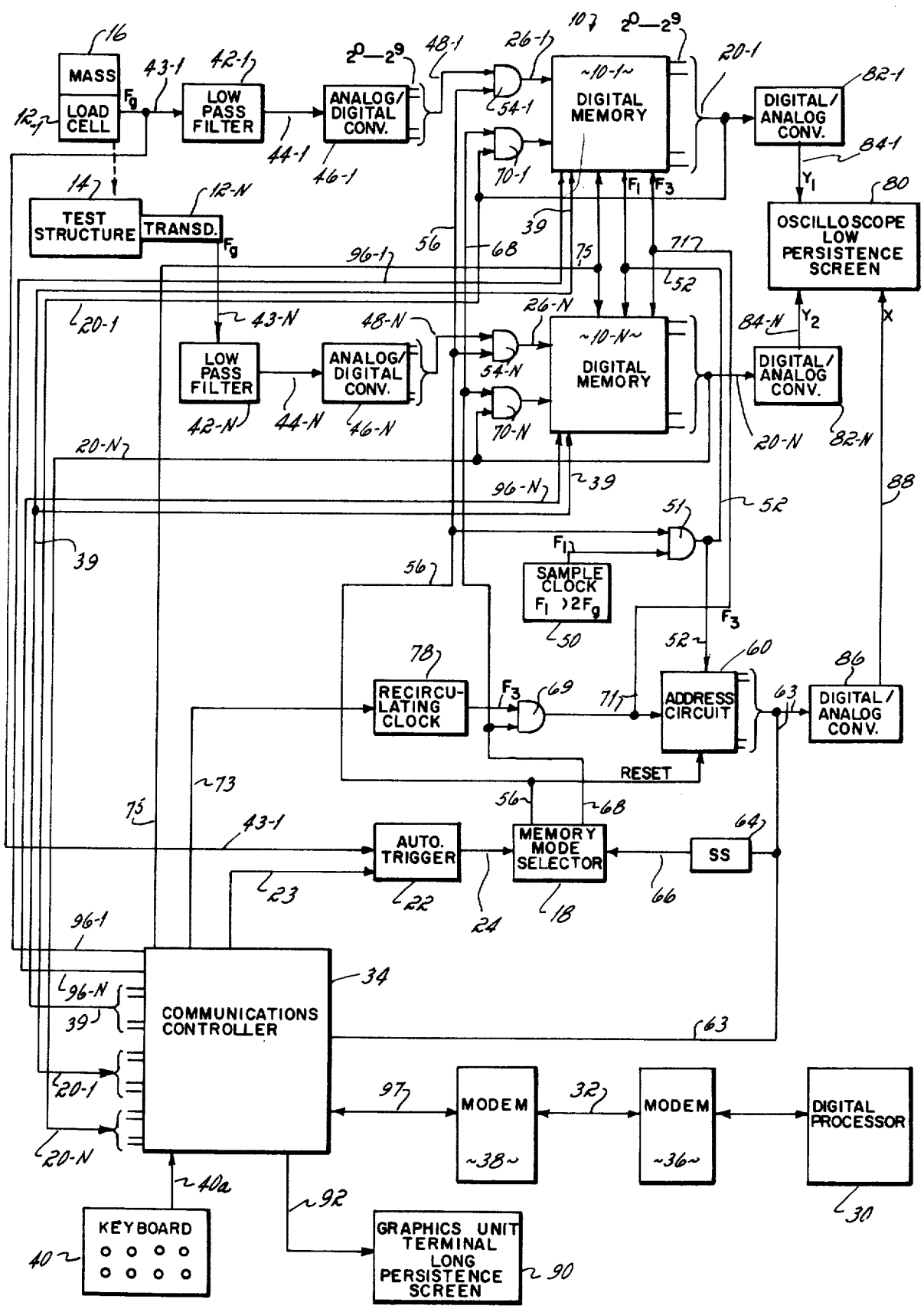

TRANSIENT ANALOG SIGNAL CAPTURE AND TRANSMISSION SYSTEM

This invention relates to the monitoring of physical phenomenon, and more particularly to a system for capturing, i.e., sampling, digitizing and recording, transient analog electrical signals having a relatively high frequency component of interest associated therewith, and thereafter transmitting said digitized analog signal samples to a remotely located digital processor over a low grade communication link having an upper frequency limit substantially less than the high frequency component of interest in the transient electrical signal.

Large scale digital processors utilizing sophisticated computer programs now exist which are capable of transforming between the time, frequency and Laplace domains, for analytical purposes, digital information associated with a physical phenomenon under test. For example, it is now possible, using specially programmed digital computers, to transform digital information in the time domain, such as time-varying deflection in a vibrating mechanical structure produced when the structure is subjected to a predetermined impact force, termed the "unit impulse response", into digital information in the frequency domain, e.g., the frequency response of the structure in which the vibration is induced. Such a transformation is known as the Fourier transform. By taking the ratio of the frequency domain information associated with a given force impulse and the frequency domain information associated with the corresponding vibrational response of the test structure, the transfer function of the structure can be obtained. A display of the transfer function graphically shows the location of the resonant frequencies of the structure.

By performing a block conjugate multiplication of the time domain input data with itself (multiplying the data and its conjugate), the autospectrum, i.e., the power spectral density, can be obtained, which is a measure of the power distribution in the frequency domain. Performing an inverse Fourier transform of an autospectrum will produce the auto correlation function of a signal. Block conjugate multiplication can also be used to obtain the cross spectrum of an input and output which, when subjected to an inverse Fourier transform, will provide the cross correlation function. By dividing the averaged cross spectrum of two signals by their respective averaged autospectrums, the coherence function is obtained which is a measurement of how coherent an output is with respect to an input.

Thus, by utilizing a large scale specially programmed digital processor, powerful scientific tools are available for analyzing input and output signals, and hence the structure itself such as the input force impulse and the output vibrational displacement of a test structure.

Unfortunately, the physical phenomenon being monitored, such as the vibrational response of a mechanical structure, is often located in the field at some distance from the specially programmed digital processor. Under such circumstances, and if the capability of a large scale specially programmed digital processor is to be used for data transformation and analysis purposes, it becomes necessary to monitor, capture, and transmit from the field the transient analog information derived from the physical phenomenon under test. In view of the economies involved, it is desirable to transmit the test data over low grade communication links. However, when low grade communication links, such as telephone lines, are utilized to transmit, to the remotely located digital processor, data derived from the physical phenomenon under consideration, serious difficulties arise.

Specifically, low grade communication links typically have an upper frequency limit which is far below the highest frequency component of interest of the physical phenomenon under consideration. For example, if the physical event being monitored provides a transient analog electrical signal having a frequency component of interest on the order of approximately 100 KHz., it is not possible to directly couple to the telephone line the transient analog electrical signal output from the transducer monitoring the physical event. A telephone line, which typically has an upper frequency limit of approximately 5 KHz., cannot transmit to a remote specially programmed digital processor, a transient analog electrical signal input directly thereto from a transducer monitoring the transient event, and still preserve the high frequency content of the analog signal.

Accordingly, it has been an objective of this invention to provide a system which can take advantage of the sophistication of specially programmed large scale digital processors, and yet permit the physical phenomenon, for example, a structure under test, to be monitored or tested at its normal site remote from the digital processor. This objective has been accomplished in accordance with the principles of this invention by providing a system which samples, digitizes and stores in a digital memory at the test site the transient analog electrical signal output from the transducer monitoring the physical phenomenon, the sampling, digitization and storage being at a frequency greater than twice the highest frequency component of interest in the transient analog signal, and thereafter outputs to a low grade communication link for transmission to the remote processor the digitized analog signal samples stored in the memory at a rate no greater than the upper frequency response limit of the communication link. In this way, a low grade communication link, having an upper frequency response limit which is substantially lower than the highest frequency component of interest in the transient analog electrical signal, can be utilized to transmit, at a rate not exceeding the frequency response limit of the communication link, digital signal samples containing the high frequency component of interest of the transient analog signal, which was sampled at a rate greater than twice the frequency of the high frequency component.

These and other advantages and objectives of the invention will be more readily apparent from a detailed description thereof taken in conjunction with the single FIGURE which is a schematic circuit, in block diagram format, of a preferred embodiment.

With reference to the figure, the preferred embodiment is seen to include a digital memory 10 having multiple channels 10-1 . . . 10-N, which preferably are shift registers although other types of memories can be used such as random access memories. Each of the digital memory channels 10-1 . . . 10-N is responsive to a mechanical/electrical transducer 12-1 . . . 12-N of the type which converts an input manifested as a physical displacement to an output manifested as an analog electrical signal correlated to the input physical displacement. Since the system of this invention is directed to monitoring physical phenomena, particularly phenomena having frequency components of interest exceeding the upper frequency response limit of low grade data link, such as audible environmental noise, natural or forced vibrations in a physical structure, strain, pressure, acceleration, velocity, force applied to a physical structure to induce vibration and/or strain, etc., and since such physical phenomena are manifested and/or capable of being sensed as a change in physical displacement, the transducers 12-1 . . . 12-N are of the type which convert a physcial displacement to an analog electrical signal. The physical displacement sensed by the transducers 12-1 . . . 12-N may be extremely small, e.g., on the order of microinches, as is the case with accelerometers using quartz crystals to convert strain induced by inertial force to an electrical analog signal correlated to the acceleration of a mass which applies an inertial force to the crystal when a sturcture to which the accelerometer is attached, accelerates.

For example, if a structure 14, such as a truck frame, is being subjected to a force impulse by impacting it with a mass 16, the transducer 12-N could be a displacement probe mounted to the test structure which converts the vibrational displacement of the structure induced by impact with mass 16 to an analog electrical signal correlated thereto. Since useful analytical information is provided by correlating (a) the vibrational displacement induced in the test structure 14 by the impact mass 16 and (b) the impact force applied to the test structure by the mass 16, a second transducer, the transducer 12-1, is included to provide an analog electrical signal correlated to the impact force applied to the test structure by the mass 16. The transducer 12-1 could be a conventional load cell located between the mass 16 and the test structure. The impact force applied to the test structure 14 by the mass 16 is manifested in the load cell transducer 12-1 as a physical displacement, providing an analog electrical signal output from the load cell which is correlated to the force applied by the mass to the test structure. While transducers which use a change in displacement to measure applied impact force and vibrational displacement of a test structure are described, it is understood that other transducers responsive to displacement can be utilized, such as accelerometers, linear velocity displacement transducers, proximity detectors, microphones and the like, to monitor the displacement-sensible variation of a parameter associated with a physical phenomenon.

Since digital memory channels 10-1 . . . 10-N are identical, only channel 10-1 is described. The digital memory 10-1 is under the control of a memory mode selector 18 such that the memory (a) stores digital information input thereto on line 26-1 correlated to the analog electrical signal output from the transducers 12-1, i.e., captures a physical event monitored by transducer 12-1, or (b) recirculates previously stored digital information, corresponding to a previously captured physical event output in analog form from transducer 12-1, which is made available on a cyclic basis at the output 20-1 of the digital memory 10-1. In the recirculate mode, new data can be entered via a common bus 39 to replace or correct recirculating data, in a manner to be described. The memory mode selector 18 is responsive to the output on line 24 of a source of trigger signals 22 such that, upon the occurrence of each trigger signal on line 24, the digital memory 10-1 is placed in its storage mode to store therein digital information input thereto on line 26-1 correlated to samples of the analog signal output from transducer 12-1.

The trigger circuit 22 has its input connected to one of the transducers 12-1 . . . 12-N, preferably the impact force sensing transducer 12-1. When so connected, the trigger circuit 22 provides an output on line 24 to the memory mode selector circuit 18, providing the trigger circuit has been armed by a signal on line 23 from a controller 34, when the analog signal output from the transducer 12-1 reaches a predetermined threshold level indicating that an analog signal is present for sampling, digitizing and storage in the associated digital memory. The output on line 24 from the trigger circuit 22 signalling that an analog signal is present for sampling, digitizing and storage, places the memory mode selector 18 in its storage mode, which in turn provides an output on line 56 to AND gates 54-1 . . . 54-N, conditioning these AND gates, which when conditioned, pass digitized analog signal samples on lines 48-1 . . . 48-N to the digital memory input lines 26-1 . . . 26-N for storage in the digital memories 10-1 . . . 10-N.

In practice it has been discovered that adequate information relative to the variation of a parameter associated with a typical physical phenomenon being monitored can be obtained by ignoring frequency components of the analog electrical signals output from the transducers 12-1 . . . 12-N above approximately 100 KHz. Accordingly, if the input to the digital memories 10-1 . . . 10-N on lines 26-1 . . . 26-N is derived from the transducers 12-1 . . . 12-N, anti-aliasing low pass filters 43-1 . . . 42-N are connected to the transducers output lines 43-1 . . . 43-N to exclude frequency components of the analog electrical signals output from transducers 12-1 . . . 12-N which exceed approximately 100 KHz. The filtered output of the low pass filters 42-1 . . . 42-N on lines 44-1 . . . 44-N are input to analog/digital converters 46-1 . . . 46-N. The analog/digital converters 46-1 . . . 46-N sample and digitize the filtered analog electrical inputs thereto on lines 44-1 . . . 44-N, providing on their respective output lines 48-1 . . . 48-N 10-bit binary words having digital values between 0 and 1023. The 10-bit words output from the respective analog/digital converters 46-1 . . . 46-N corresponding to the digital values of the sampled analog signals input on their respective input lines 44-1 . . . 44-N appear in parallel on their respective 10 output lines $2^0, 2^1, \ldots 2^9$ which collectively constitute the analog/digital converter output lines 48-1 . . . 48-N of analog/digital converters 46-1 . . . 46-N, respectively.

The analog/digital converters 46-1 . . . 46-N are provided with suitable strobe, sampling or clocking pulses at a frequency $F_1$ which is at least greater than twice the frequency of the highest frequency component of interest in the analog electrical signal output from the transducers 12-1 . . . 12-N on lines 43-1 . . . 43-N. In practice, the sample rate of the analog/digital converters is in the range of 10 Hz.-200 KHz. (sampling intervals in the range of 100 milliseconds-5 microseconds), corresponding to maximum frequency components of interest in the analog test signal in the range of 5 Hz.-100 KHz., respectively. The sampling pulses are provided on line 52 to the analog/digital converters 46-1 . . . 46-N by a sample clock 50 having a selectively variable sampling rate. The sample clock 50, in addition to strobing the analog/digital converters 46-1 . . . 46-N at a frequency $F_1$ which is greater than twice the highest frequency component of interest in the analog electrical signal output from the transducers 12-1 . . . 12-N, also strobes the digital memories 10-1 . . . 10-N at the frequency $F_1$ to facilitate storage of the digitized analog signal sample input thereto on lines 26-1 . . . 26-N. An AND gate 51 is located in line 52, conditioned by an enter data output on line 56 from the memory mode selector 18, passes sampling pulses to the memories 10-1 . . . 10-N, analog digital converters 46-1 . . . 46-N, and an address circuit 60, to be described, only when the memory mode selector is in the store mode.

As is well known in the art, to facilitate the conversion of sampled analog signals present on lines 44-1 . . . 44-N to digital signals present on output lines 48-1 . . . 48-N, suitable sample and hold circuitry is included in, or associated with, each analog/digital converter 46-1 . . . 46-N.

The digitized analog signal samples from the transducers 12-1 . . . 12-N are input to the digital memories 10-1 . . . 10-N via AND gates 54-1 and 54-N which are conditioned for passing digitized analog signal samples to the digital memories by the memory mode selector 18. Specifically, when the memory mode selector 18 is placed in its storage mode by a trigger signal 24 from a trigger circuit 22 indicating that an analog signal from the transducer 12-1 is present for sampling, digitizing, and storing, the memory mode selector provides an output on line 56 to enable the AND gates 54-1 . . . 54-N. With AND gate 54-1 . . . 54-N enabled by the memory mode selector 18, digitized analog signal samples present on lines 48-1 . . . 48-N are input on lines 26-1 . . . 26-N for storage in the digital memories 10-1 . . . 10-N.

An address circuit 60, preferably a counter, is responsive to the trigger signal on line 24 as well as the sample clock pulses on line 52. The counter of the address circuit 60 is reset to zero by the trigger signal on line 24 each time a new analog signal is present for sampling, digitizing and storage. Once reset, the address circuit counter 60 begins counting at a rate $F_1$ established by sample clock 50 correlated to the rate at which the analog signal from transducers 12-1 . . . 12-N is sampled and stored in the digital memories 10-1 . . . 10-N. At any given time the instantaneous count in the address circuit 60 is correlated to the address, with reference to the last trigger signal on line 24, of the memory storage location whose contents are being output on digital memory output lines 20-1 . . . 20-N. If the digital memories 10-1 . . . 10-N are in the recirculation mode, having previously received a trigger signal and stored data from the transducers 12-1 . . . 12-N, at any given instant the output of the address circuit 60 is correlated to the number of samples stored in the digital memory between the samples then being accessed for output on memory lines 20-1 . . . 20-N and the first samples which were stored in the memories following the trigger signal which initiated storage of sampled analog information which is recirculating.

A monostable multivibrator 64, which has its input line 63 connected to the output of the address circuit 60, provides a control signal on output line 66 to the memory mode selector 18 for switching the memory mode selector from the storage mode to the recirculate mode when the digital memories 10-1 . . . 10-N have been filled to capacity with digitized samples of the analog information output from transducers 12-1 . . . 12-N. Thus, the memory mode selector 18 is responsive to the output on line 63 from the address circuit 60 via the single shot 64. This output on line 66 is produced when, after the occurrence of a trigger signal on line 24 indicating the presence of an analog signal from transducer 12-1, the entire digital memory 10-1 has been filled with digitized analog signal samples from the input on line 26-1 for switching the memory mode from the storage mode to the recirculate mode. In the recirculate mode the information previously input to the memory on line 26-1 will be recirculated until the next trigger signal is produced on line 24 from the trigger circuit 22.

The memory mode selector 18 is normally in the recirculate mode providing an output on line 68 to condition AND gates 70-1 . . . 70-N connected between the output links 20-1 . . . 20-N of the digital memories 10-1 . . . 10-N and the digital memory input lines 72-1 . . . 72-N, and to condition AND gate 69 between a recirculate clock 78 and the address circuit 60. With the memory selector in the recirculate mode, digitized analog signal samples stored in the digital memories 10-1 . . . 10-N recirculate at a rate established by the recirculate clock 78 having a selectively variable clocking frequency $F_3$. As the digitized analog signal samples recirculate in the digital memories 10-1 . . . 10-N via lines 72-1, 72-N, the address circuit 60 receives recirculate pulses via conditioned AND gate 69 and provides on its output line 71 an address in binary format corresponding to the number of stored samples which occurred between (a) the first stored samples coincident with the trigger signal output on line 24 from the trigger circuit 22 at the start of the sampling cycle and (b) the recirculating samples currently being accessed by the memory and output on lines 20-1 . . . 20-N. The recirculate pulses from recirculate clock source 78 gated by AND gates 69 are input to the memories 10-1 . . . 10-N via line 71 to clock into the memories the data recirculating in lines 72-1 . . . 72-N.

Under certain circumstances, to be described hereafter, when the mode selector 18 is in the recirculate mode, recirculate clock 78 is disabled by a signal on line 73 from controller 34 and clock signals for recirculating data are provided on line 75 from the controller 34.

Upon the occurrence of the next analog signal to be sampled output from the transducer 12-1 on line 43-1, and providing the trigger circuit 22 has been armed by an input from the controller 34 on line 23, a trigger signal is produced on line 24 resetting the memory mode selector 18. This removes the conditioning signal on line 68, disabling AND gates 70-1 . . . 70-N and AND gate 69, terminating the recirculation of digitized signal samples in the digital memories 10-1 . . . 10-N via lines 72-1 . . . 72-N and the stepping of the address circuit counter 60 from the recirculate clock 78.

Switching of the memory mode selector 18 in response to a trigger signal on line 24 coincident with the beginning of the next analog signal on line 43-1 to be sampled, places an enable, or condition, signal on line 56 to AND gate 54-1 . . . 54-2 permitting digitized analog signal samples present on lines 48-1 . . . 48-N to be input to the digital memory 10-1 . . . 10-N via lines 26-1 . . . 26-N. The trigger signal on line 24 coincident with the beginning of an analog signal to be sampled is also input to the address circuit 60 resetting the counter therein. The address circuit 60, having been reset, is now input with clock pulses from the sample clock 50 via enabled gate 51 at a sample rate $F_1$ corresponding to the rate at which the analog signal is being sampled, digitized and stored. As noted, when memory mode selector 18 is in the store mode, the output of the address circuit 60 at any given time corresponds to the number of samples between (a) the first sample of the sampled analog signal and (b) the digitized analog signal sample presently being input to the digital memory on lines 26-1 ... 26-N for storage.

When the count in the address circuit 60 reaches a value corresponding to the memory capacity of the digital memory 10-1 ... 10-N, indicating that the memories are entirely filled with the digitized analog signal samples, an output is produced on line 63 which, via the monostable multivibrator 64, provides an input on line 66 to the memory mode selector placing the memories in the recirculate mode. The AND gates 54-1 ... 54-2 are now disabled preventing the storage in the digital memories of any new digitized signal samples. AND gate 51 is also disabled preventing the address circuit 60 from being responsive to strobe pulses from the input clock 50. AND gates 70-1 ... 70-N are enabled to facilitate recirculation via input lines 72-1 ... 72-N of digitized signal samples output from the digital memory on lines 20-1 ... 20-N. In addition, AND gate 69 is enabled permitting the address circuit 60 to respond to the output of the recirculate clock 78 such that the output of the address circuit on line 63 will be correlated to the address of the recirculating signal samples present on lines 20-1 ... 20-N.

Associated with each of the digital memories 10-1 ... 10-N is a display device 80 in the form of an oscilloscope having a low persistence screen. By low persistence screen is meant a screen in which the phosphor does not retain for any appreciable time an image after the electron beam, which produced the image, has impinged thereon. The output of the digital memories 10-1 ... 10-N on lines 20-1 ... 20-N are coupled to Y coordinate inputs of the oscilloscope via digital/analog converters 82-1 ... 82-N and lines 84-1 ... 84-N. The digital/analog converters 82-1 ... 82-N function to reconstruct in analog form the recirculating digital signal samples present on digital memory output lines 20-1 ... 20-N. Associated with the oscilloscope 80 is a digital/analog converter 86 which is coupled between the digital address output of the address circuit 60 on line 63 and an input line 88 corresponding to the X coordinate, time base, or horizontal sweep input of the low persistence screen oscilloscope 80.

As the digitized analog signal samples recirculate in digital memories 10-1 ... 10-N, analog inputs corresponding thereto are provided to the Y coordinate inputs of the oscilloscope on input lines 84-1 ... 84-N while addresses in analog form corresponding to the addresses of the recirculating signal samples on lines 20-1 ... 20-N are input to the oscilloscope X coordinate input on line 88. The analog signals input to the oscilloscope on lines 84-1 ... 84-N, corresponding to the reconstructed analog signal samples, constitute the Y inputs, ordinates, or amplitudes of the reconstructed analog signal samples, while the address signals input on line 88 constitute the X coordinate, or abscissa, of the analog signal. Collectively, the Y coordinate inputs on lines 84-1 ... 84-N and the X coordinate input on line 88 provide recurring plots, or traces, on the oscilloscope screen of the amplitudes of the reconstructed analog signals versus time stored in memories 10-1 ... 10-N, respectively.

Since the screen of the oscilloscope 80 is of the low persistence type, to avoid flickering of the amplitude versus time plot of a reconstructed analog signal displayed thereon, it is necessary that the recirculate clock 78 recirculate the digitized analog signal samples in the memories 10-1 ... 10-N at a rate $F_3$ sufficient to provide visual continuity, i.e., avoid flickering of the oscilloscope trace. If the analog signal being sampled is relatively long in duration, the sample rate $F_1$ of the sample clock necessary to completely fill the memory with digitized signal samples may be below the horizontal sweep frequency of the oscilloscope 80 necessary to provide a visually continuous, non-flickering trace. In such case, the recirculate clock 78 provides clocking pulses to the digital memories 10-1 ... 10-N and to the address circuit 60 at a frequency $F_3$ which exceeds the signal sampling frequency $F_1$ output from the input clock 50.

A sampling rate below the horizontal sweep frequency of the oscilloscope necessary to provide a visually continuous, non-flickering trace may also result with analog events of relatively short duration with respect to the length of the memory, if the highest frequency components of interest of the analog signal is less than 50% of the horizontal sweep rate and sampling is done at a rate only slightly greater than twice the highest frequency component of the analog signal. In such case the digital memories 10-1 ... 10-N may not be completely filled with digitized analog signal samples in the course of recording a single event.

The digitized analog signal samples stored in the digital memories 10-1 ... 10-N, in addition to being displayed on the low persistence screen of the oscilloscope 80, may also be displayed on a high persistence screen of a graphics unit, such as that marketed by Tektronix, Inc., Beaverton, Oregon, designated Model 4012. If such display is desired the digitized signal samples stored in memories 10-1 ... 10-N and present on output lines 20-1 ... 20-N are input to a graphics unit 90 on line 92 via the communication controller 34. The controller 34 converts the digitized signal samples output from a selected one of the memories 10-1 ... 10-N on lines 20-1 ... 20-N, each sample being in the form of a 10-bit word, with the bits in parallel, to four ASCII symbols of 11 bits each, with the symbols in series and bits of each one of the symbols in parallel. Selection of the memory output to be displayed is accomplished by the controller 34 which reads data on only the selected memory output lines 20-1 ... 20-N. The controller 34, in addition to converting the digitized signal samples output on one of the lines 20-1 ... 20-N of the selected memory 10-1 ... 10-N to the appropriate format for the graphics display unit 90, also provides appropriate clocking pulses on line 75 to all the digital memories 10-1 ... 10-N. The clocking pulses on line 75 input digitized analog signal samples from the selected memory 10-1 ... 10-N via one of the lines 20-1 ... 20-N to the controller 34 for formatting at a rate compatible to the rate at which the formatted digitized analog signal samples are input to the graphics display 90 via line 92. Typically, the formatted digitized analog signal samples input to the display unit 90 on line 92 from the selected one of the memories 10-1 ... 10-N are input at a rate of approximately 125 digitized analog signal samples per second. Accordingly, the controller 34 provides clocking pulses on line 75 to the digital memories 10-1 ... 10-N at a frequency of 125 Hz. This corresponds to a Baud rate of 9600 for line 92. The clock pulses on line 75 to the memories 10-1 ... 10-N, both the selected memory and the unselected memories, are effective to recirculate the data in these memories. During the time the contents of the selected memory 10-1 ... 10-N are output to the controller 34 for formatting and transmission to the graphics unit 90, the recirculate clock 78 is disabled via a disable signal on line 73 from controller 34.

The digitized analog signal samples stored in the digital memories 10-1 . . . 10-N may also be transmitted to a remote digital processor 30 over a low grade full duplex communication link 32 which is provided at each end with modems 36 and 38 which interface with the processor 30 and the controller 34, respectively. To accomplish this the digitized analog signal samples present at memory output lines 20-1 . . . 20-N are input to the controller 34 where a selected one of the lines 20-1 . . . 20-N is read and converted to a format compatible with the modem 38. In one illustrative form the 10-bit words (with the bits in parallel) corresponding to the analog signal samples input to the controller 34 on a selected one of the lines 20-1 . . . 20-N are each converted to two 8-bit words which are input to the modem 38 serial-by-word and serial-by-bit. Thus, the 10 parallel bits corresponding to a single analog signal sample output from, e.g., line 20-1, are converted by controller 34 and output on line 97 to the modem 38 in the form of two serial 8-bit words with the bits of each word presented serially. When data from a selected memory 20-1 . . . 20-N is being formatted by the controller 34, the recirculate clock is disabled via a disable signal on line 73, and the contents of all memories 10-1 . . . 10-N are recirculating at the rate at which the sample of the selected memory output lines 20-1 . . . 20-N are being read by the controller 34, which rate corresponds to the rate determined by clock pulses on common clock line 75 from controller 34. The modem 38, in response to the formatted digitized analog signal samples input thereto on line 97, provides tone signals on communication link 32 which are received by the remotely located modem 36 and reformatted for input to the digital processor 30. The communication link 32, in terms of its upper transmission frequency limit, is relatively low grade. Typically, the communication link 32 transmits bits in the form of frequency shift keying tone signals, with the tones having frequencies on the order of 1,000–3,000 Hz., and with the bit transmission rate being in the range of 110–1200 Baud. For example, with a Baud rate of 300 for the transmission link 32 and the line 97, approximately 15 digitized analog signal samples are transmitted each second to the digital processor 30.

As noted, when the digitized signal samples of a selected memory 10-1 . . . 10-N are read for transmission to the remote digital processor 30, the controller 34, in addition to formatting the read samples for transmission, also clocks all the memories 10-1 . . . 10-N to recirculate the digitized samples from all the memories 10-1 . . . 10-N. This is accomplished with the clock signals on line 75 transmitted from the controller 34 to the memories 10-1 . . . 10-N. The clocking rate is equal to the rate at which digitized analog signal samples, which have been formatted by the controller 34 and converted into tones by modem 38, are transmitted over low grade communication link 32.

The system of this invention, in a manner to be described, is also capable of returning to the remote station for storage in memories 10-1 . . . 10-N and/or display in graphics terminal 90, sampled, stored, and digitized analog electrical signal which have been previously transmitted via line 32 to the high speed digital processor 30 whereat they were transformed, e.g., changed from the time domain to the frequency domain, and returned in transformed form to the remote station via link 32. With respect to such returning transformed samples, the controller reformats the data received over communication link 32, which is output from modem 38, for input to the memories 10-1 . . . 10-N and/or to the graphics terminal 90 via line 92.

In a typical case the sampling rate $F_1$ at which analog signals are sampled, digitized and stored in the memories 10-1 . . . 10-N greatly exceeds the rate at which it is capable to transmit digitized signal samples from the digital memory 10 to the digital processor 30 over the communication link 32. Hence, the rate at which the digitized analog signal samples stored in the selected one of memories 10-1 . . . 10-N are clocked out by line 75 and read by the controller 34 is vastly slower than the rate at which the analog signal was sampled. Thus, the system of this invention has the capability of sampling at a very high rate, e.g., approximately 200 KHz., analog signals having a maximum frequency component under consideration of up to approximately 100 KHz.; storing the digitized analog signal samples at up to a 200 KHz. storage rate; and outputting the stored digitized analog signal samples from the memories 10-1 . . . 10-N at a substantially slower rate for reading and formatting by the controller 34 for transmission to a digital processor at a remote location over a low grade communication line having an upper frequency limit far less than the highest frequency component under consideration in the analog signal being sampled. Stated differently, with the system of this invention, physical phenomena can be monitored by sampling and locally storing, at rates up to approximately 200 KHz., transient electrical signals having relatively high frequency components, e.g., up to approximately 100 KHz., and thereafter transmitting the captured transient signal, which is stored in a local memory, over a low grade communication link having an upper frequency limit far below the highest frequency component of interest present in the captured transient analog electrical signal which was sampled and stored.

As a consequence, a large scale digital processor located at a remote station can be time-shared, using inexpensive communication links such as low grade telephone lines, with multiple transient analog signal samplers and recorders located at the different sites of the different physical phenomena being monitored. The transient analog signal sampler and recorder can be brought to the site of the physical phenomenon being monitored, for example, a gas pipe line located at some remote geographic point which is being monitored for pressure surges. Once at the site, the transient analog electrical signals corresponding to the pressure surges, and which have high frequency components of interest up to, e.g., 100 KHz., can be captured, i.e., sampled and stored, for transmission over a low grade communication link, telephone line 32, to a distant high speed digital processor. At the processor, the recorded digitized transient analog signal samples can be processed in a variety of ways and the processed information transmitted back over the same low grade communication link, e.g., telephone line 32, where, after receipt by the modem 38 and reformatting by the controller 34, they are input to the digital memories 10-1 . . . 10-N where they can, for example, be displayed by the graphics terminal 90 in the manner previously described. Thus, a transient analog electrical signal containing high frequency information in the time domain can be transmitted over a low grade telephone line 32 to the high speed digital processor 30 where it is Fourier transformed to the frequency domain, transmitted back to the local station via low grade telephone line 32, and the frequency domain information, e.g., frequency content of a pipe line pressure surge, displayed on the graphics terminal 90.

As noted previously, transient analog electrical signals which have been stored in the memory 10, transmitted to the digital processor 30 via line 32, processed, and retransmitted to the local station via communication line 32, in addition to being input to the graphics unit 90 via the modem 38 and controller 34, can instead be input to the digital memory 10. In such case, the controller 34 reformats the processed data received from the digital processor 30 via low grade communication link 32 into a format compatible with the digital memory 10, namely, into a 10-bit parallel word for each received processed sample. The reformatted samples are then input to digital memories 10-1 . . . 10-N via line 39 where they are stored in synchronism with suitable clocking pulses provided to the memories by the controller over line 75. Specially programmed large scale digital processors, capable of transforming (a) digitized analog signal samples correlated to deflections at different points on a vibrating structure into (b) a form suitable for analysis of the structure, are available, on a time-shared basis, from Structural Dynamics Research Corporation, Cincinnati, Ohio, designated The SDRC DAD II Mode Analysis time share service. Once stored in the digital memory 10, the processed data received from the digital processor 30 can be displayed in the graphics unit 90 by passing it through the controller 34 and thence to the graphics terminal over line 92.

An illustration of where it would be desirable to return processed samples from the digital processor 30 to the digital memory 10 via the controller 34 before displaying the processed signals at the graphics terminal 90, would be where it is desired to display the mode shape of a vibrating structure, that is, a changing display of the structure showing the variation in deflection of the vibrating structure at different points thereon for a given resonance condition.

It is also possible with the system of this invention to modify digitized analog signal samples stored in the memories 10-1 . . . 10-N. To accomplish this, a keyboard terminal 40 is provided. By suitable entry into the keyboard 40, the digital memories 10-1 . . . 10-N can be selectively accessed such that a digitized analog signal sample to be changed in the selected memory can be modified as desired in accordance with entries made in the keyboard 40. For example, knowing the X coordinate of a particular transient analog signal displayed on the graphics unit 90, by entering into keyboard 40 the X coordinate of displayed transient signal sample to be changed as well as the value to which it is desired to change the displayed sample, the sample as stored in a particular memory 10-1 . . . 10-N can be changed. Entry of the X coordinate facilitates accessing the memory 10-1 . . . 10-N in question, such that the Y value, i.e., ordinate of the accessed sample, is changed in accordance with the value entered into the keyboard 40. The controller 34 formats the information input to the keyboard 40 and clocks it to all the memories 10-1 . . . 10-N over line common bus 39 while supplying clock pulses thereto over common clock line 75. Only the memory selected by a suitable control signal on line 96-1 . . . 96-N enters the corrected sample. The nonselected memories merely recirculate data at the clock rate of the clock pulses on line 75.

The keyboard terminal 40 is also used to introduce various commands into the system. For example, a receive command entered into the keyboard 40 readies the system to receive data from the digital processor 30 for storage in the digital memory 10. This same receive command also facilitates storage of a corrected sample entered into the keyboard 40 in a selected one of the memories. Similarly, a transmit command causes the system to transmit data stored in the digital memory 10 to the processor 30 via the controller 34, modems 38 and 36 and low grade communication link 32. In addition, a display command entered into the keyboard 40 causes the system to display at the graphics unit 90 the data stored in the digital memory 10. Other suitable commands can be entered into the system to accomplish other operational functions.

Processed samples received from the digital processor 30 via the communication link 32, as indicated, are typically received at a rate well below 100 samples per second. If such samples were directly input to a display of the low persistence type, such as oscilloscope 80, it would not be possible to have a continuous visual display of the information. Moreover, even if the received processed samples were first input to the digital memory 10 and then recirculated therein for display in the oscillator 80 at a rate corresponding to that at which the processed samples were received over the communication link 32, it would not be possible to have a non-flickering display due to the low persistence nature of the oscilloscope screen. However, with the system of this invention the processed samples received at a relatively low rate, e.g., below 100 samples per second, from the processor 30 over communication link 32 can be input to the digital memory 10 for storage at a rate equal to the rate of receipt over the data link 32. Once stored, the received processed samples can be recirculated through the memory 10 at a stepped-up rate sufficient to provide, when input to the low persistence screen oscilloscope 80, a visually continuous non-flickering display.

The disclosure of Riemenschneider et al. U.S. patent application Ser. No. 497,757, filed Aug. 15, 1974, assigned to the assignee of this application, is specifically incorporated herein in its entirety by express reference thereto.

The controller 34 may take the form of a hard-wired circuit, or a specially programmed microporcessor.

In order to more fully understand the structure and operation of the system of this invention, an operational sequence is described in which a transient analog electrical signal produced when the mass 16 strikes the test structure 14 is amplified, digitized and stored in the memory; viewed on the low persistence screw oscilloscope 80 and the long persistence screen graphics unit 90; the value of a sample of a stored signal corrected and the stored signal as corrected viewed on the oscilloscope 80 and graphic unit 90; the stored information, as corrected, transmitted to the remote digital processor 30 and retransmitted and displayed on the local graphics unit 90 to ascertain that the information was properly transmitted; the transmitted information processed at the digital processor 30 and the processed information transmitted to the test site where it is stored in the digital memory for subsequent display or the like.

The foregoing operational sequence is initiated by adjusting the sample clock 50 such that the sample clock pulses output therefrom are at the appropriate frequency with respect to the highest frequency component of the analog signal sample to be captured, digitized, stored, analyzed, transmitted, etc. The sample clock 50 should be set such that the sample rate is greater than twice the highest frequency component of interest of the analog signal under consideration. In addition, the recirculate clock 78 is adjusted such that the recirculate clock pulses output therefrom are at the desired rate. For example, if the information is to be stored on the low persistence screen oscilloscope 80, the recirculate clock 78 should be set such that the output frequency thereof exceeds the horizontal sweep frequency necessary to provide a continuously visible non-flickering trace.

Once the sample clock 50 and recirculate clock 78 have been adjusted, an appropriate command is entered into the keyboard 40 to arm the automatic trigger circuit 22. The keyboard entry 40 via line 40a and the communication controller 34 provides an output on line 23 to the automatic trigger circuit 22, conditioning the circuit to produce an output on line 24 when the output on line 43-1 from the load cell transducer 12-1 reaches a predetermined threshold value indicating that the mass 16 has struck the test structure 14.

With the auto-trigger circuit 22 suitably armed, the mass 16 is allowed to strike the test structure 14. When the mass does in fact strike the test structure 14 the force transmitted by the mass to the test structure is transduced by the load cell 12-1 and an analog signal provided on line 43-1 correlated to the magnitude of the force. When the analog signal on line 43-1 reaches a predetermined threshold value sufficient to exclude false triggering due to noise or the like the previously armed automatic trigger circuit 22 provides a pulse on its output line 24 to the memory mode selector circuit 18. The memory mode selector circuit 18 switches from its normal recirculate mode to the enter data or storage mode, providing a conditioning signal level on line 56. The conditioning signal on line 56 resets the address circuit 60 to zero and conditions gate 54-1 . . . 54-N to facilitate entry of digitized analog signal samples into the memories 10-1 . . . 10-N. In addition, the conditioning signal output from the memory mode selector 18 on line 56 conditions gate 51 to gate sample clock pulses from the sample clock 50 to the analog/digital converters 46-1 . . . 46-N on line 52 to facilitate sampling and digitizing of the analog signals output from transducers 12-1 . . . 12-N. The sample clock signals are also gated by gate 51 to the digital memories 10-1 . . . 10-N to facilitate storage therein of the digitized analog signal samples input thereto from the analog/digital converters 46-1 . . . 46-N via enabled gates 54-1 . . . 54-N. The sample clock pulses output on line 52 are also input to the address circuit 60 advancing the address circuit counter. When the digital memories 10-1 . . . 10-N are filled an output is provided by the address circuit 60 on line 63 to a single shot circuit 64. The single shot circuit 64 in turn provides a memory mode selector reset pulse on line 66, switching the memory mode selector 18 to the recirculate mode. With the memory mode selector 18 in the recirculate mode the conditioning signal on line 56 is removed, preventing data from being input to the memories 10-1 . . . 10-N from the analog/digital converters 46-1 . . . 46-N, as well as preventing sample clock pulses generated from clock 50 from being input to the digital memories 10-1 . . . 10-N, the analog/digital converters 46-1 . . . 46-N, or the address circuit 60.

When the memory mode selector circuit 18 is switched to its recirculate mode in response to filling of the memories 10-1 . . . 10-N, a conditioning signal is provided on line 68 to recirculate data AND gates 70-1 . . . 70-N and to recirculate clock pulse AND gate 69. With AND gate 69 conditioned, recirculate clock pulses output from the recirculate clock 78 are input to the digital memories 10-1 . . . 10-N as well as to the address circuit 60. The recirculate clock pulses input to the digital memories 10-1 . . . 10-N effect recirculation of the digital memory outputs on lines 20-1 . . . 20-N to the digital memories 10-1 . . . 10-N via conditioned AND gate 70-1 . . . 70-N. The recirculate clock pulses gated by the conditioned AND gate 69 to the address circuit 60 causes the address circuit counter to be stepped to continuously provide on its output line 63 signals correlated to the addresses of the recirculating samples output from the digital memories 10-1 . . . 10-N on lines 20-1 . . . 20-N. The recirculating information in the digital memories 10-1 . . . 10-N can be viewed on the low persistence screen of the oscilloscope 80 in the manner described previously. The data continues recirculating in the memories 10-1 . . . 10-N at the rate set by the recirculate clock 78.

To display in the graphics unit 90 the captured transient electrical signal recirculating in a particular digital memory, e.g., the force signal in digital memory 10-1, a display command is entered into the keyboard 40 identifying the memory whose contents are to be displayed. The display command is coupled to the communication controller 34 via line 40a where it is effective to produce, in combination with an input to the communication controller on line 63 signalling the fact that the beginning of the stored signal is now present on output line 20-1 of the digital memory, a signal on line 73 stopping the recirculate clock 78 and thereby terminating the output of recirculate clock pulses. The memory mode selector 18 is still in the recirculate mode, placing a conditioning signal on line 68. The communication controller 34 now reads the digitized analog signal sample input to it on memory output line 20-1, formats it for the display in the graphics unit 90 and transmits the formatted sample to the graphic unit 90 to effect the display. A clock signal is then provided by the controller 34 on line 75 to all the digital memories 10-1 . . . 10-N to place the next digitized analog signal samples on the memory output lines 20-1 . . . 20-N. The communication controller 34 now reads the output on line 20-1 of the memory 10-1 selected for display, formats it, and transmits it to the graphics unit 90 for display. This process is repeated until all the digital samples in the selected memory 10-1 have been read by the communication controller, formatted, and transmitted to the graphics unit 90 for display.

When all the digitized analog signal samples have been displayed, the communication controller 34 provides an input on line 92 to the graphics unit 90 to effect the overlay of a grid on the graphics display screen to facilitate identification of the X and Y coordinate points of each displayed point. In addition, the communication controller 34 provides on line 92 a signal to the graphics unit 90 to effect a display of the identity of the particular digital memory channel the contents of which are displayed by the graphics unit.

As the digitized samples in the selected memory 10-1 are being read and formatted by the communication controller 34 and transmitted to the graphics unit 90 for display, the contents of all digital memories 10-1 . . . 10-N are being recirculated at the rate established by the clock signals on line 75 via the recirculate gates 70-1 . . . 70-N which are enabled or conditioned by the output on line 68 from the memory mode selector 18 which is still in the recirculate mode.

When all digitized signal samples in the digital memory 10-1 have been read on line 20-1, formatted by controller 34 and transmitted to the graphics unit 90 via line 92 for display, a signal is provided on line 73 to the recirculate clock 78 allowing the recirculate clock 78 to again output recirculate clock pulses. The recirculate clock pulses are then input to the digital memories 10-1 ... 10-N to cause the contents thereof to recirculate at the recirculate clock frequency. The clocking signals on line 75 to the digital memories from controller 34 terminate with the production of the signal on line 73 which restarts the recirculate clock 78.

To correct an analog signal sample stored in a particular one of the digital memories 10-1 ... 10-N, such memory, 10-1 displayed in the graphics unit 90, a suitable receive command is entered into the keyboard 40 along with the designation of the digital memory 10-1 containing the sample to be corrected, the X coordinate location of the sample to be corrected and the corrected value of the sample. With the foregoing entries into the keyboard 40, the communication controller 34 provides, when a signal is received on line 63 indicating that the first sample stored in the digital memory 10-1 is output line 20-1, an output on line 73 to the recirculate clock 78 terminating recirculate clock pulses. The communication controller 34 now provides clock pulses to all the memories 10-1 ... 10-N on line 75 to recirculate the data therein such that the digital signal sample in memory 10-1 to be corrected is the next sample to be input to the digital memory 10-1. The communication controller 34 then enters into the digital memory 10-1, the new value for the sample to be corrected thereby effecting the correction. The corrected sample is output on data bus 39 to digital memories 10-1 ... 10-N. However, only digital memory 10-1 stores the corrected sample value by reason of the fact that only this memory receives a control signal on line 96-1 enabling storage thereof when the next clock signal appears on common clock line 75 which is input to all the digital memories.

If the sample to be corrected was in digital memory 10-N a control signal would be transmitted to this memory via line 96-N such that the corrected sample value transmitted to all the memories on common data bus 39 would be stored in digital memory 10-N when suitably clocked on common clock line 75. Since the new sample value is entered only into the digital memory 10-1, the other memories which do not receive control signals on lines 96-2 ... 96-N recirculate data when clocked on common clock line 75. After the corrected sample value has been input to the digital memory 10-1 the recirculate clock disable signal on line 73 is removed and the recirculation clock 78 again begins to output recirculation pulses all memories 10-1 ... 10-N to facilitate recirculation of the data in the digital memories 10-1 ... 10-N. No further clock signals are output on common clock line 75 from controller 34.

The corrected information recirculating in digital memory 10-1 can be viewed on graphics unit 90 in the manner described previously.

Data stored in a digital memory, such as memory 10-1, is transmitted to the remote processor 30 by first establishing a communication link between the digital processor 30 and the controller 34. This is done by dialing the digital processor 30 from the remote location in accordance with well established time sharing techniques. A suitable transmit command, which also identifies the selected transmitting memory 10-1, is entered into the keyboard 40, which via the communication controller 34 and the communication line 32, instructs the digital processor 30 to accept data from memory 10-1. The transmit command entered into the keyboard 40, in addition to readying the digital processor 30 for receipt of data, also causes digitized signal samples recirculating in the selected digital memory 10-1 to be transmitted to the digital processor.

Specifically, a stop recirculate clock signal on line 73 is provided by the controller to the recirculate clock 78, terminating the output of recirculate clock signal from AND gate 69. This, as indicated previously, occurs when a signal is provided to the communication controller on line 63 indicating that the first sample recorded in memory 10-1 is output on line 20-1. The first signal sample output on line 20-1 is now read by the communication controller 34, formatted, and transmitted to the digital processor 30 via line 97, modem 38, communication link 32 and modem 36. The first sample is also transmitted to the graphic unit 90 via line 92 for display thereat. The digital memory 10-1 is then clocked via line 75 to present the second sample on line 20-1 to the communication controller 34 where it is read, formatted, and transmitted to the digital processor 30 and the graphics unit 90. This process of clocking the digital memory 10-1 via line 75, reading the memory output on line 20-1, formatting and transmitting to the digital processor and the graphics unit 90 continues until the entire contents of the selected digital memory 10-1 have been read, formatted, and transmitted to the graphics unit 90 and the digital processor 30. As the data is being advanced in the selected memory 10-1 by the clock signal on line 75 for transmission purposes, the data in nonselected memories 10-2 ... 10-N is recirculating since the memory mode selector 18 is still in the recirculate mode, the recirculate rate being at the rate of the clock pulses on common clock line 75. When the last sample in digital memory 10-1 has been read by the controller 34, formatted and transmitted to the digital processor 30 and the graphics unit 90, a signal is provided on line 63 to the controller 34 to provide a start recirculate clock signal on line 73 to the recirculate clock 78. This in turn causes recirculate clock signals to be output from the recirculate clock to recirculate the contents of the digital memories 10-1 ... 10-N at a rate corresponding to the setting of the recirculate clock. Clock signals on common clock line 75 terminate.

If desired, the data transmitted to the digital processor 30 from the digital memory 10-1 can be retransmitted from the digital processor for display at graphics unit 90. This facilitates a check to insure that the data was transmitted correctly. The foregoing is accomplished by entering a suitable command into the keyboard 40 which in turn causes the communication controller 34 to issue a command to the digital processor 30 over the communication link, causing transmission of the information previously transmitted to the processor. The data received from the processor 30, as received, is properly formatted for display in the graphics unit 90 and is routed directly from the communication controller 34 to the graphics unit 90 via line 92.

After having viewed the transmitted data on graphics unit 90, if it is desired to command the digital processor 30 to process the transmitted information, such as to perform a Fourier transform on the transmitted data, a suitable command is entered into the keyboard 40. The command is transmitted to the digital processor 30 via the controller 34 and the communication link. After processing by the digital processsor 30, the processor sends a receive command to the controller via the communication link. Following this, the digital processor 30 transmits the processed data over the communication link 32 to the communication controller 34 where it is inserted into the digital memory 10-1 in much the same manner as described in connection with the data correction routine previously discussed.

While the invention has been described using as an illustration an embodiment in which the remote monitoring station initiates transmission of digitized analog signal samples which have been captured by calling a central digital processor over a low grade communication link, those skilled in the art will understand that transmission of the captured data could be initiated in other manners. For example, the central processor could initiate transmission of the digitized analog signal samples by calling the remote station via the low grade data link and requesting transmission of the digitized analog signal samples corresponding to the last captured event, in response to which the remote station would clock out the digitized signal samples from its digital memory for formatting in the controller prior to transmission over the low grade data link.

In the preferred embodiment the digitized analog signal samples, such as the digitized values of vibrational amplitude of a vibrating structure, constitutes information in the time domain, which is then transmitted over a low grade communication link to a digital processor as time domain information, albeit at a data transmission rate much slower than the rate at which the data was initially sampled. In accordance with embodiment of the invention, digitized analog signal samples in the time domain are first converted to digitized signal samples in another domain, for example, the frequency domain, by a suitable digital processor located at the remote station, and the domain-transformed digitized samples then transmitted via low grade communication link to the central digital processor for further processing.

Finally, the high frequency component of interest in the preferred embodiment of the invention was a high frequency signal component in analog signal samples output from a single transducer monitoring a particular physical phenomenon. Those skilled in the art will understand that high frequency signal components can be produced by sampling at high frequency a plurality of different physical phenomenon which individually do not have frequency components. In such case, while each individual physical phenomenon signal sample is devoid of high frequency signal components, the composite signal produced when the samples of the different individual phenomena are combined, does have high frequency components correlated in frequency to the frequency at which the different physical phenomenon were sampled.

Having described the invention, what is claimed is:

1. A method for monitoring a physical phenomenon manifested by a change in displacement produced by the application of a time-varying force capturing an analog electrical signal associated therewith having a component of interest at a given frequency not exceeding approximately 100 KHz. and transmitting said captured signal over a low grade communication link having an upper frequency limit substantially less than said given frequency, said method comprising:

transducing the variation in displacement associated with said changing physical phenomenon produced by said time-varying force with a displacement transducer to produce an analog electrical signal having a component of interest at a given frequency not exceeding approximately 100 KHz., generating a trigger signal, generating sampling signals at a first predetermined rate greater than twice said given frequency of said analog electrical signal component of interest, sampling said analog signal output from said displacement transducer, under control of said sampling signals, at said first predetermined rate, converting said analog signal samples output from said sampling means into digital signal samples, each digitized signal sample including plural data signals in parallel, storing at said first predetermined rate, said digital signal samples output from said converter in a digital memory accessed under control of said trigger and sampling signals, accessing said digital memory at a second predetermined rate substantially lower than 100 KHz., to ready for transmission, at said second predetermined rate, said stored digital signal samples, said transmission being via a communication link having a frequency response limit exceeding said second rate and substantially lower than 100 KHz., transmitting said stored plural data signals of each stored digital signal samples serially over the communication link at said second predetermined rate to a digital processor remote from said displacement transducer and said digital memory, performing a mathematical transformation on said transmitted high frequency-containing digital samples in said digital processor to mathematically transform said high frequency-containing samples into a form useful for analyzing said physical phenomenon being monitored, whereby digital signal samples containing a component of interest of an analog signal having a frequency not exceeding approximately 100 KHz. are conveyed to a remote digital processor for processing thereat over a low grade communication link having an upper frequency response limit which is substantially lower than 100 KHz. at a rate not exceeding said frequency response limit, transmitting said processed signals from said remote processor over said low grade communication link at a receiving rate not exceeding said upper frequency response limit of said communication link, and visually displaying said received processed signals transmitted from said digital processor, whereby interaction on a substantially real time basis occurs between said remote digital processor and test personnel at the site of said physical phenomenon being monitored whereat said transducer is located.

2. The method of claim 1 further including the step of:

transforming, prior to transmission over said communication link, digitized analog signal samples containing information in the time domain into digitized analog signal samples in another domain.

3. The method of claim 2 wherein said transforming step includes transforming said time domain samples into frequency domain samples.

4. The method of claim 1 wherein:
said signal generating step also includes generating readout signals at a third predetermined rate, said third predetermined rate being less than said first rate, and wherein said digital memory has a storage capacity of N, where N is an integer greater than one, and wherein said digital memory is accessed by said communication controller at said receiving rate not exceeding said upper frequency response limit of said communication link, to receive processed digital signal samples from said digital processing means via said communication link, and wherein said processed digital signal samples are input to said digital memory means which, under control of said communication controller stores said processed digital signal samples, said digital memory means being accessed and said processed digital signal samples being input thereto for storage at said receiving rate, the method further including reading out of said digital memory said processed digital signal samples at said third predetermined rate in response to said readout signals and under control of said communication controller.

5. The method of claim 1 wherein said signal generation step also includes generating readout signals at a predetermined display rate and wherein said digital memory has a storage capacity of N, where N is an integer greater than one, said method further including:
counting said readout signals in a count-to-N counter under control of said trigger signal and in response thereto generating a digital count signal representative of the count contained therein,
reading out in response to said readout signals said digital signal samples stored in said digital memory at said predetermined display rate,
converting in a second converter said digital count signal to an analog count display signal,
converting, at said predetermined display rate and in a third converter, said digital signal samples stored in said digital memory to analog signal display samples as said digital signal samples are readout from said digital memory at said display rate,
visually displaying in said visual display means, in response to said analog count display signals and analog signal display samples, said analog signal in reconstructed form,
whereby said reconstructed analog electrical signal may be inspected prior to transmission of said digital data signals to said digital processing means.

6. The method of claim 1 wherein said signal generating step also includes generating readout signals at a predetermined display rate, and wherein said digital memory has a storage capacity of N, where N is an integer greater than one, and wherein said digital memory is accessed by said communication controller at said predetermined receiving rate to receive, at said predetermined receiving rate, processed digital signal samples from said digital processing means via said communication link, and wherein said processed digital signal samples are input to said digital memory means which, under control of said communication controller stores said processed digital signal samples, said digital memory means being accessed and said processed digital signal samples being input thereto for storage at said predetermined receiving rate, the method further including:
counting said readout signals in a count-to-N counter under control of said communication controller and generating a digital count signal representative of the count contained therein,
reading out from said digital memory said processed digital signal samples at said predetermined display rate in response to said readout signals and under control of said communication controller,
converting, in a second converter, said digital count signal in said counter to an analog count display signal,
inputting said analog count display signals to said display means,
converting, in a third converter, said processed digital signal samples stored in said digital memory to analog signal display samples, said processed digital signal samples being input to said third converter from said digital memory as said processed digital signal samples are readout at said predetermined display rate inputting said analog signal display samples to said display means,
whereby processed digital signal samples to be visually perceptively displayed in analog form by said display means are transmitted over a low grade communication link at said receiving rate not exceeding said upper frequency response limit of said low grade communication link.

7. The method of claim 1 wherein said mathematical transformation step includes a domain transformation.

8. The method of claim 7 wherein said domain transformation includes a transfer between the time domain and another domain.

9. The method of claim 7 wherein said domain transformation includes a transfer between the time and frequency domains.

10. The method of claim 7 further including the steps of:
applying an external time-varying force to a structure to cause it to exhibit vibrating displacement,
transducing the force applied to said structure for providing an analog electrical signal correlated to the variation in force applied to said structure,
sampling, converting, storing, accessing, transmitting over said low grade link to said processor and mathematically transforming at said processor said force signals, and
transmitting over said low grade link mathematically transformed force signals in conjunction with said displacement signals for display to facilitate analysis of said structure.

11. A system for monitoring a physical phenomenon manifested by a change in displacement, produced by the application of a time-varying force, capturing analog electrical signals associated therewith having a component of interest at a given frequency not exceeding approximately 100 KHz., and transmitting said captured signal over a low grade communication link having an upper frequency limit substantially less than said given frequency, said system comprising:
a displacement transducer for providing an analog electrical signal correlated to a variation in displacement associated with a changing physical phenomenon being monitored by said transducer, which variation in displacement is produced by the application of a time-varying force, said analog electrical signal having a component at a given frequency not exceeding approximately 100 KHz.,
trigger means for generating a trigger signal, a signal generator for generating sampling signals at a first predetermined rate greater than twice said given frequency of said analog electrical signal, analog signal sampling means responsive to said analog signal output from said displacement transducer and under control of said sampling signals for sampling at said first predetermined rate said analog signal input thereto from said transducer, a converter responsive to said analog signal samples input thereto from said sampling means for converting said analog signal samples into digital signal samples, each digitized sample including plural data signals in parallel, a digital memory responsive to said digital signal samples and under control of said trigger and sampling signals for storing said digital signal samples, said memory being accessed and said digital signal samples being input thereto from said converter at said first predetermined rate, digital processing means located remote from said displacement transducer and digital memory, for processing said digital signal samples, said processor being programmed to perform a mathematical transformation of said high frequency containing samples to facilitate analysis of said changing physical phenomenon, a low grade communication link having an upper frequency response limit substantially lower than 100 KHz. for interconnecting said digital memory and said digital processing means, and a communication controller for accessing said digital memory at a second predetermined rate to transmit serially, at said second predetermined rate, said stored digital signal samples from said digital memory to said digital processing means via said communication link, said second predetermined rate being substantially lower than 100 KHz. and not exceeding said upper frequency response limit of said communication link, said plural data signals comprising each said stored digital signal sample being transmitted serially over said low grade communication link, whereby a low grade communication link having an upper frequency response limit which is substantially lower than 100 KHz. can be utilized to convey to said digital processor, at a rate not exceeding said upper frequency response limit of said communication link, digital signal samples containing said component of interest of said analog signal having a frequency not exceeding approximately 100 KHz., which samples were obtained at a sample rate equal to at least twice said given frequency of said component of interest;

means for transmitting said processed signals from said remote processor over said low grade communication link at a receiving rate not exceeding said upper frequency response limit of said communication link, and visual display means responsive to said processed signals transmitted from said digital processor over said low grade communication link at said receiving rate for visually displaying said processed signals, whereby interaction on substantially real time basis occurs between said digital processor remote therefrom and test personnel at the site of said physical phenomenon being monitored whereat said transducer is located.

12. The system of claim 11 wherein said trigger means is responsive to said analog signal for generating a trigger signal when said analog signal is input thereto from said displacement transducer.

13. The system of claim 12 wherein said trigger means includes a threshold detector to generate said trigger signal when the amplitude of said analog signal exceeds a predetermined threshold level.

14. The system of claim 11 wherein said trigger means is responsive to actuation of a switch means for generating a trigger signal.

15. The system of claim 14 wherein said switch means is manually actuated.

16. The system of claim 11 wherein said analog signal output from said displacement transducer includes information in the time domain, said system further including:

means responsive to the output of said digital memory for transforming, prior to transmission over said communication link, said digitized signal sample containing information in the time domain to digitized signal samples containing information in another domain.

17. The system of claim 16 wherein said transforming means transforms said time domain samples into frequency domain samples.

18. The apparatus of claim 11 wherein:

said signal generator also generates readout signals at third and fourth predetermined rates, said third and fourth predetermined rates being less than said first predetermined rate, and wherein said digital memory has a storage capacity of N, where N is an integer greater than one, and wherein said communication controller also accesses said digital memory at said receiving rate not exceeding said upper frequency response limit of said communication link, to receive said processed digital signal samples from said digital processing means via said low grade communication link, and wherein said digital memory is also responsive to said processed digital signal samples and under control of said communication controller for storing said processed digital signal samples received from said remote digital processor, said digital memory being accessed and said processed digital signal samples being input thereto at said receiving rate, said system further including readout means responsive to said readout signals at said third and fourth predetermined rates in first and second modes, respectively, under control of said communication controller in said first and second modes, respectively, for reading out of said digital memory signal samples and said processed digital signal samples, respectively, from said digital memory at said third and fourth predetermined rates, respectively, in said first and second modes, respectively.

19. The system of claim 11 wherein said signal generator also generates readout signals at a predetermined display rate and wherein said digital memory has a storage capacity of N, where N is an integer greater than one, and further including:

a count-to-N counter responsive to said readout signals and under control of said trigger signal for generating a digital count signal representative of a count contained therein, said readout means being responsive to said readout signals for reading out said digital signal samples stored in said digital memory at said predetermined display rate, a second converter responsive to said digital count signal in said counter for converting said digital count signal to an analog count display signal, a third converter responsive to said digital signal samples stored in said digital memory for converting said digital signal samples to analog signal display samples, said digital signal samples being input thereto from said digital memory as said digital signal samples are readout at said predetermined display rate, and said visual display means being responsive to said analog count display signals and analog signal display samples for displaying said analog signal in reconstructed form, whereby said reconstructed analog electrical signal may be inspected prior to transmission of said digital data signals to said digital processing means.

20. The system of claim 11 wherein said signal generator also generates readout signals at a predetermined display rate, and wherein said digital memory has a storage capacity of N, where N is an integer greater than one, and wherein said communication controller also accesses said digital memory at a predetermined receiving rate to receive, at said predetermined receiving rate, said processed digital signal samples from said digital processing means via said communication link, and wherein said digital memory means is also responsive to said processed digital signal samples and under control of said communication controller for storing said processed digital signal samples, said digital memory means being accessed and said processed digital signal samples being input thereto at said predetermined receiving rate, further including:

- a count-to-N counter responsive to said readout signals and under control of said communication controller for generating a digital count signal representative of a count contained therein,
- said readout means being responsive to said readout signals at said predetermined display rate and under control of said communication controller for reading out said processed digital signal samples stored in said digital memory at said predetermined display rate,
- a second converter responsive to said digital count signal in said counter for converting said digital count signal to an analog count display signal, said analog count display signal being input to said display means,
- a third converter responsive to said processed digital signal samples stored in said digital memory for converting said processed digital signal samples to analog signal display samples, said processed digital signal samples being input thereto from said digital memory as said processed digital signal samples are readout at said predetermined display rate said analog signal display samples being input to said display means,
- whereby said low grade communication link having an upper frequency response limit can be utilized to convey, at said predetermined receiving rate not exceeding said frequency response limit, processed digital signal samples to be displayed in analog form by said display means.

21. The system of claim 11 wherein said mathematical transformation includes a domain transformation.

22. The system of claim 21 wherein said domain transformation includes a transfer between the time domain and another domain.

23. The system of claim 21 wherein said domain transformation includes a transfer between the time and frequency domains.

24. The system of claim 11 further including:
- means for applying an external time-varying force to a structure to cause it to exhibit vibrating displacement,
- a force transducer for providing an analog electrical signal correlated to the variation in force applied to said structure, and
- means for inputting the output of said force transducer to said analog signal sampling means wherein said analog signal sampling means, converter and digital memory sequentially respond to said force transducer output signal whereby digital signal samples correlated to said force stored in said memory are available for transmission over said low grade communication link under control of said communication controller to said remote digital processing means for transformation thereby and return over said communication link to said visual display means for analysis.

* * * * *

UNITED STATES PATENT AND TRADEMARK OFFICE
CERTIFICATE OF CORRECTION

PATENT NO. : 4,112,425
DATED : September 5, 1978
INVENTOR(S) : Gerald J. Zobrist et al It is certified that error appears in the above-identified patent and that said Letters Patent are hereby corrected as shown below:

In column 17, line 34, after "In accordance with" insert --another--.

In column 17, line 51, before "frequency" insert --high--.

In column 17, line 61, insert a comma (,) after "displacement".

In column 17, line 65, insert a comma (,) after "100 kHz."

In column 17, line 67, between the words "frequency" and "limit" insert --response--.

In column 18, lines 14-15, delete "output from said sampling means".

In column 18, line 18, insert a comma (,) after "storing".

In column 18, line 19, delete "output from said converter".

In column 18, line 30, "samples" should be --sample--.

In column 18, line 35, delete "digital".

In column 18, line 48, "signals" should be --digital signal samples--.

UNITED STATES PATENT AND TRADEMARK OFFICE
CERTIFICATE OF CORRECTION

PATENT NO. : 4,112,425

DATED : September 5, 1978

INVENTOR(S) : Gerald J. Zobrist et al

It is certified that error appears in the above-identified patent and that said Letters Patent are hereby corrected as shown below:

In column 18, line 48, after "remote" insert --digital--.

In column 18, line 53, "signals" should be --digital signal samples--.

In column 18, line 58, between the words "said" and "transducer" insert --displacement--.

In column 19, line 8, "said", first occurence, should be --a--.

In column 19, lines 10-11, "processing means" should be --processor--.

In column 19, line 14, delete "means".

In column 19, line 17, delete "means".

In column 19, line 44, "said" should be --a--.

In column 19, line 50, "data signals" should be --signal samples--.

In column 19, line 50, "processing means" should be --processor--.

UNITED STATES PATENT AND TRADEMARK OFFICE
CERTIFICATE OF CORRECTION

PATENT NO. : 4,112,425
DATED : September 5, 1978
INVENTOR(S) : Gerald J. Zobrist et al Page 3 of 6

It is certified that error appears in the above-identified patent and that said Letters Patent are hereby corrected as shown below:

In column 19, line 56, "said" should be --a--.

In column 19, line 59, "processing means" should be --processor--.

In column 19, line 61, delete "means".

In column 19, line 64, delete "means".

In column 20, line 12, "said" should be --a--.

In column 20, lines 20-21, delete "inputting said analog signal display samples to said display means" and insert --inputting said analog signal display samples to said display means,-- as a new paragraph.

In column 20, line 53, after "capturing" insert --an--.

In column 20, line 54, "signals" should be --signal--.

In column 20, line 58, between the words "frequency" and "limit" insert --response--.

In column 20, line 63, between the words "said" and "transducer" insert --displacement--.

UNITED STATES PATENT AND TRADEMARK OFFICE
CERTIFICATE OF CORRECTION

PATENT NO. : 4,112,425
DATED : September 5, 1978
INVENTOR(S) : Gerald J. Zobrist et al It is certified that error appears in the above-identified patent and that said Letters Patent are hereby corrected as shown below:

In column 20, line 66, after "component" insert --of interest--.

In column 21, line 3, after "signal" insert --component of interest--.

In column 21, line 8, between the words "said" and "transducer" insert --displacement--.

In column 21, lines 22-23, "processor" should be --digital processing means--.

In column 21, line 24, insert a hyphen between the words "frequency" and "containing".

In column 21, line 46, "processor" should be --processing means--.

In column 21, line 55, "signals" should be --digital signal samples--.

In column 21, line 56, "processor" should be --digital processing means--.

UNITED STATES PATENT AND TRADEMARK OFFICE
CERTIFICATE OF CORRECTION

PATENT NO. : 4,112,425
DATED : September 5, 1978
INVENTOR(S) : Gerald J. Zobrist et al It is certified that error appears in the above-identified patent and that said Letters Patent are hereby corrected as shown below:

In column 21, line 61, "signals" should be --digital signal samples--.

In column 21, line 61, "processor" should be --processing means--.

In column 21, lines 63-64, "signals" should be --digital signal samples--.

In column 21, line 65, "processor" should be --processing means--.

In column 21, line 68, between the words "said" and "transducer" insert --displacement--.

In column 22, lines 20-21, change "sample" to --samples--.

In column 22, line 44, "processor" should be --processing means--.

In column 22, line 52, after "memory" insert --said digital--.

In column 22, line 57, "11" should be --18--.

In column 23, line 19, "data signals" should be --signal samples--.

UNITED STATES PATENT AND TRADEMARK OFFICE
CERTIFICATE OF CORRECTION

PATENT NO. : 4,112,425
DATED : September 5, 1978
INVENTOR(S) : Gerald J. Zobrist et al It is certified that error appears in the above-identified patent and that said Letters Patent are hereby corrected as shown below:

In column 23, line 20, "11" should be --18--.

In column 23, line 29, delete "means".

In column 23, line 33, delete "means".

In column 24, line 11, insert a comma (,) after "rate".

Signed and Sealed this

Eleventh Day of December 1979

[SEAL]

Attest:

SIDNEY A. DIAMOND

Attesting Officer     Commissioner of Patents and Trademarks